United States Patent [19]

Gates

[11] 4,261,681
[45] Apr. 14, 1981

[54] ARTICLE TRANSFER APPARATUS

[75] Inventor: Gerald A. Gates, Jericho Center, Vt.

[73] Assignee: International Business Machines Corporation, Armonk, N.Y.

[21] Appl. No.: 934,776

[22] Filed: Aug. 18, 1978

[51] Int. Cl.³ .................. B65G 47/91; B65G 29/00
[52] U.S. Cl. .......................... 414/744 B; 414/225
[58] Field of Search ............ 414/744, 737, 735, 675, 414/618, 72, 121, 225; 221/211

[56] References Cited

U.S. PATENT DOCUMENTS

| | | | |
|---|---|---|---|
| 2,889,962 | 6/1959 | Foster | 221/211 X |
| 3,207,363 | 9/1965 | Pollack, Jr. | 221/211 |
| 3,275,189 | 9/1966 | Goldsborough et al. | 221/211 X |
| 3,453,714 | 7/1969 | Clark et al. | 29/714 |
| 3,616,942 | 11/1971 | Gruber | 414/744 X |
| 3,894,636 | 7/1975 | Tonus | 414/737 X |
| 3,941,233 | 3/1976 | Ainola . | |
| 3,973,682 | 8/1976 | Neff . | |

Primary Examiner—Frank E. Werner
Attorney, Agent, or Firm—Francis J. Thornton

[57] ABSTRACT

This describes an improved apparatus for transferring articles along an arcuate path. The apparatus has a multi-armed turret driven by a stepping motor around a center point. The turret has an article holding head on the end of each arm to which vacuum and pressure must be applied at different times. The vacuum and pressure is applied to the holding head from fixed sources through a single rotary vacuum-pressure distributive valve. The valve is comprised of a fixed input plate and motor driven rotary output plate mounted thereon. The rotary output plate is coupled to the turret by flexible tubing and driven by a second stepping motor in synchronization with the turret driving stepping motor. This synchronous driving of the output plate of the valve with a motor separate from that driving the turret prevents the valve vacuum-pressure loading friction from affecting the turret drive. This reduces accumulative rotary error in the turret.

3 Claims, 5 Drawing Figures

ARTICLE TRANSFER APPARATUS

BACKGROUND OF THE INVENTION

1. Field of the Invention

This invention relates generally to rotating machinery in which articles are to be transported by a vacuum head carrier and positively removed from the vacuum head by a pulse of air pressure with the air pressure pulses and vacuum being delivered to the carrier through a rotary distributor valve. More particularly, this invention relates to rotary distributor valves for delivery of both air pressure and vacuum to selected points.

2. Description of the Prior Art

Rotating machinery, which utilizes a rotary valve for the delivery of both vacuum and air pressure to selected points, for the positioning of articles is shown in U.S. Pat. No. 3,453,714 by Clark et al. This patent is assigned to the same assignee as the present invention. This patent shows a vacuum operated chip placement machine which is provided with a rotating turret having a multiplicity of arms connected to a distributive valve for delivering metered vacuum to selected ones of the arms at selected times so as to pick up the multiplicity of chips. The vacuum being delivered through the valve tends to cause the sliding parts of the valve to tightly adhere to one another, the sliding friction forces between the parts of the valve is greatly increased requiring greater power to accurately position the arms of the turret.

U.S. Pat. No. 3,973,682, also assigned to the same assignee as the present invention, discloses a pick up apparatus mounted on a rotary spider. The pick up apparatus shown in this patent requires the selective application of both pressure and vacuum to the pick up head. In one such a case first air and then vacuum and then both air and vacuum is delivered to the pick up head through one or more rotary valves. When a single valve is used for both air and vacuum distribution the accurate positioning of the turret arms to the same point each time they arrive at a selected area becomes increasingly difficult because of the variation in pressure between the plates and the valve. For example, when vacuum is being applied, the sliding parts of the valve are held tightly together and the frictional loss between the sliding parts of the valve is greatly increased, but when air pressure alone is being applied, the air pressure forces the sliding parts apart reducing the friction loss. When air pressure is applied at one point in the valve and vacuum at another point in the valve, a still different frictional load is realized. When the valve, as shown in the prior art, is part of the turret these changes in friction in the valve results in uneven and uncontrollable variations in the position of the arms. That is, when there are heavy frictional losses the turret may undershoot the desired position and when the losses are low or nonexistent the turret may overshoot the desired position. Thus in the prior art mechanisms the positional accuracy of the product is affected by the frictional loads on the valve.

SUMMARY OF THE INVENTION

The present invention avoids all such difficulties and prevents the frictional losses of the valve from being applied to the turret. Thus eliminating variations in placement of the turret or head due to variations in the frictional losses of the valve.

It is therefore an object of the present invention to provide an improved rotary distributive valve for use with vacuum pressure pick up mechanism.

It is a further object of the invention to provide a unique vacuum pressure pick up rotary mechanism in which the turret arms of the pick up mechanism and the rotary distributive valve mechanism are independently driven by synchronized motor mechanisms.

It is still further an object of the invention to provide an improved rotating turret mechanism utilizing both vacuum and pressure to position objects which turret can be brought to the same fixed position on each rotation of the turret with an accuracy greater than that previously known to such positioning apparatus.

These and further objects of the present invention can be more fully appreciated from the accompanying drawings in which.

DESCRIPTION OF THE PREFERRED EMBODIMENT

Figure 1:
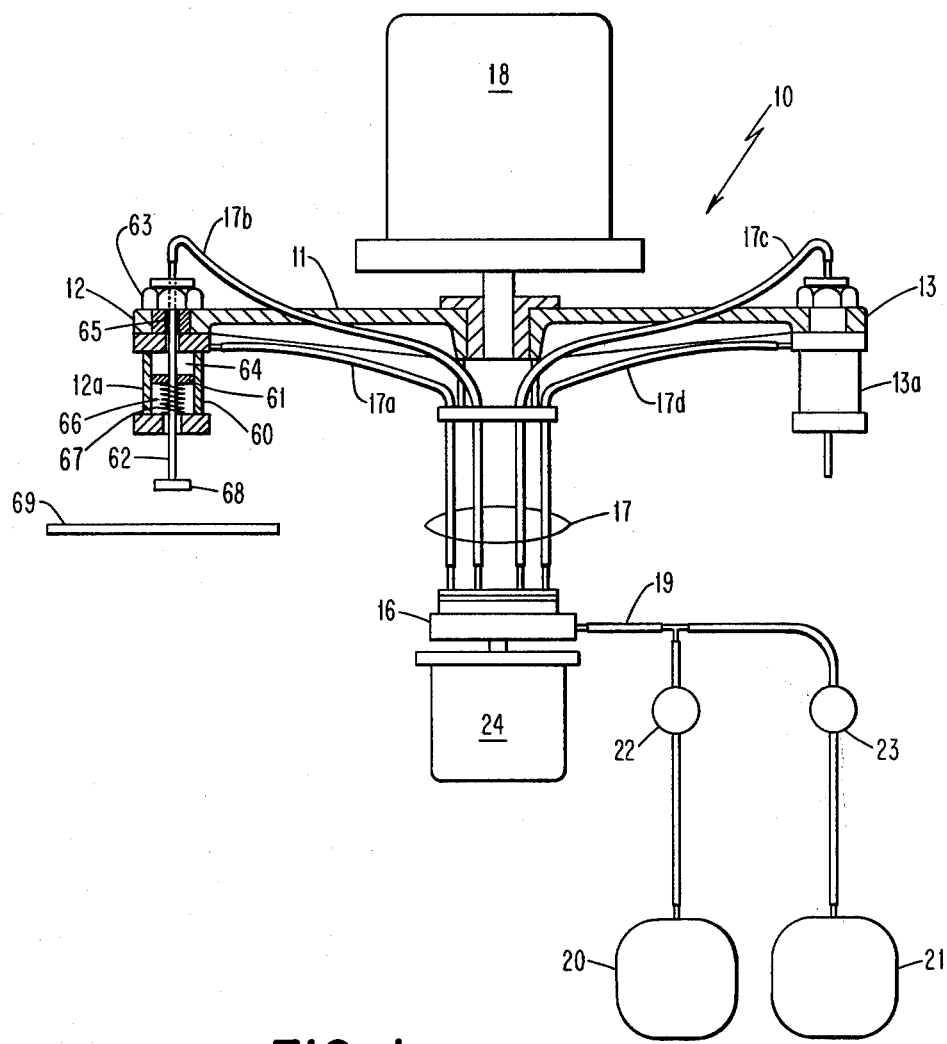
FIG. 1 shows a partial cross-sectional view of the apparatus for the present invention.

With reference now to the figures and especially to FIG. 1 there is shown a rotating turret mechanism 10 composed of a turret 11 having a plurality of arms 12 and 13 thereon. For the sake of convenience, the turret 11 is shown with only two arms. However, such turrets may be provided with many more arms. This turret is driven by a stepping motor 18 mounted over the center of the turret 11. On the end of each arm 12 and 13 there are provided respective pick up assemblies 12a, 13a. These assemblies are coupled through a rotary distributive valve 16 and a plurality of flexible tubings 17 to sources of vacuum 20 and to sources of air pressure 21. The rotary valve 16 is driven by a second stepping motor 24 that is driven synchronously with the turret driving stepping motor 18.

Figure 2:
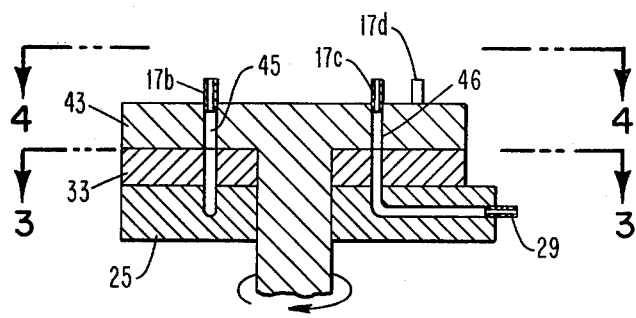
FIG. 2 shows a cross-sectional view of the rotating distributive valve of the invention.
Figure 3:
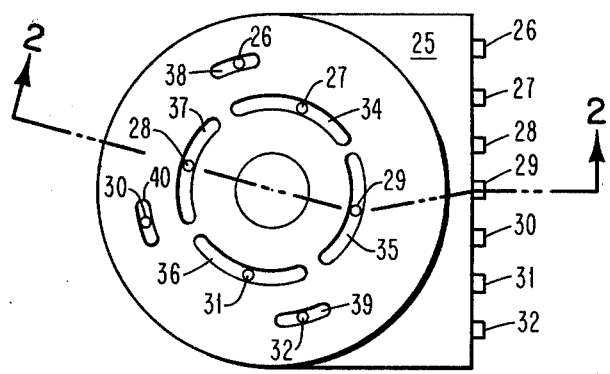
FIG. 3 shows a top view of the bottom half of the rotary distributive valve of FIG. 2.
Figure 4:
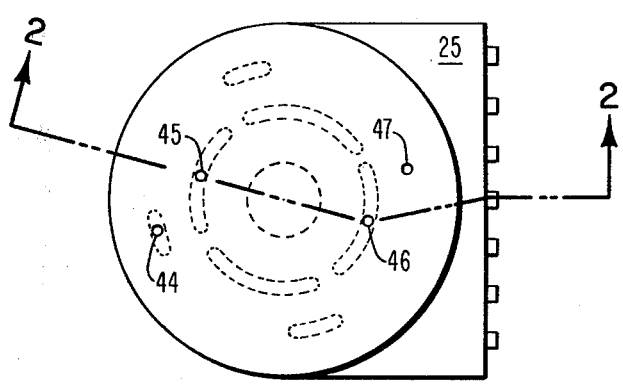
FIG. 4 shows a top view of the rotary distributive valve.

The rotary distributor valve mechanism 16 is more fully shown in FIGS. 2, 3 and 4 and comprises a distributor head 25, a fixed plate 33 and a rotary plate 43 coupled by a shaft to motor 24. The distributor head 25 is provided with a plurality of conduits 26, 27, 28, 29, 30, 31 and 32. Each of these conduits is connected by valved piping 19 to the sources of vacuum 20 and pressure 21. Each section of piping leading to each respective conduit is provided with suitable shut off valves 22 and 23 so that either vacuum or pressure can be selectively applied to a selected conduit at any selected time. Although each conduit is individually connected to the sources, for the sake of simplicity of illustration only one pipe 19 and one set of valves 22 and 23 are shown in FIG. 1.

It should be noted that the conduits 27, 28, 29 and 31 in the distributor head are arranged to intersect with respective selected arcuate channels 34, 35, 36, and 37 formed in the fixed plate 33. In a similar fashion, conduits 26, 30 and 32 intersect respective outer arcuate channels 38, 40 and 39. The rotary plate 43 is provided with four through holes 44, 45, 46 and 47 that are coupled to the flexible tubings 17a, 17b, 17c and 17d, respectively. Holes 44 and 47 are positioned to intersect the outer arcuate channels 38, 39 and 40 while holes 45 and 46 are positioned to intersect the inner arcuate channels 34, 35, 36 and 37.

With reference now to all the figures and particular reference to FIG. 5, there will be described a single pressure-vacuum cycle as would be applied to one of the pick up assemblies on end of one of the turret arms. For purposes of this description, the pick up assembly 12a on the end of arm 12 will be discussed. It will also be assumed that the turret will be rotated in a clockwise direction from the position shown in FIG. 1.

Since each pick up assembly on the end of the turret arm is structurally identical to every other assembly, only one need be described. As shown in cross-section in FIG. 1, the pick up assembly is a very simple device. The assembly comprises a hollow housing 60 having a central movable piston 61 carrying a hollow needle 62. The housing 60 is held on the turret arm 12 by a nut 63. The needle 62 extends through the piston 61 in both directions and passes axially out of the housing. The piston 61 separates the housing into an upper chamber 64 and a lower chamber 66. The upper chamber 64 communicates through a flexible tubing 17a to through hole 44 provided in the rotary plate 43. The hollow needle 62 is surrounded by a seal 65 where it passes out of the top of housing 60 and is connected through flexible tubing 17b to through hole 45. The lower chamber 66 is provided with a spring 67 biasing piston 61 upwards. The pick up head 13a on the end of arm 13 is built in an identical manner and also has a needle coupled through tubing 17c to through hole 46. The internal upper chamber of this head 13, not shown, is coupled through tubing 17d to through hole 47.

Initially, the turret in the position shown in FIG. 1 and for purposes of illustration this position will be designated as the zero-degree position. It should be clearly understood that only the cycle of vacuum and pressure sequences applied to the pick up assembly 12 will be discussed in conjunction with FIG. 5. Those applied to the pick up assembly 13a will be identical to that described but would be 180° out of phase. The top series of pulses are those applied through tubing 17a to drive the piston 61 and the lower series of pulses are those applied to the pencil 62.

Initially, as shown, tubing 17a is connected to through hole 44 and is communicating with the conduit 30 through channel 40 and tubing 17b is connected to through hole 45 and is communicating with the conduit 28 through channel 37. It will be assumed that a product 68 is held on the end of the needle 62 by a vacuum, shown as pulse 70 drawn through tubing 17b and conduit 28. Pressure as indicated by pulse 71 is applied to chamber 64 causing the piston 61 and the attached needle 62 to be forced down towards the bottom of the housing 60 so that product 68 carried by the needle 62 is caused to come in contact with a designated pick up station 69. Once the product 68 is in contact with the pick up station 69, the vacuum (pulse 70) drawn through needle 62 is broken and a pressure pulse 72 is applied through conduit 28, channel 37 and tubing 17b to needle 62 to cause the product 68 to be positively forced off the end of the needle 62. After a suitable time, pressure pulse 72 is reduced to atmospheric pressure indicated by line 73. As soon as pulse 72 is reduced, the pressure pulse 71, in chamber 64 is also reduced and a vacuum shown as pulse 74 is drawn through tubing 17a to cause the piston 61 and the needle 62 joined to it to be quickly returned up to its up, i.e., initial, position. Both stepping motors 18 and 24 are now synchronously activated to step the turret and rotary plate 43, 90° in a clockwise direction as indicated by the arrow in FIG. 2. Once the piston is in its up position it will be retained there by spring 67. The vacuum pulse 74 is terminated as hole 44 passes from over channel 40. As the plate 43 rotates to the 90° position, the interior of the tube 17a is permitted to return to atmospheric pressure as indicated by line 75. When the turret stops at the 90° position, the through hole 44 and tubing 17a is now located over channel 38 and conduit 26 while the through hole 45 and tubing 17b is located over the channel 34 and the conduit 27.

In this 90° position, a pressure pulse 76 is applied to tubing 17a through conduit 26 to cause the piston 61 and hence needle 62 to descend to a pick up position. Simultaneously a vacuum is drawn in conduit 27 which applies a vacuum to the needle 62 via tubing 17b as shown by line 77. This vacuum, in needle 62, causes a product, not shown, to be picked up and held on the end of the needle 62. By suitable detecting means, not shown, it can be determined if the pick up of the product is made by the needle. Once pick up of the product is accomplished a vacuum indicated by pulse 78 is drawn in chamber 64 through tubing 17a to return the needle to its up position where it is held by spring 67. Once piston 61 is pulled up, the stepping motors 18 and 24 are again both synchronously activated to rotate the turret 11 and the plate 43 to the 180° position. As the plate 43 is rotated, the vacuum, shown as pulse 78, applied through tubing 17a to chamber 64 is broken and the chamber 64 is permitted to go to atmospheric pressure as indicated by line 79. As through hole 45 passes the end of channel 34, vacuum is also drawn in channel 35 via conduit 29. Even so, the vacuum in needle 62 may be slightly reduced as indicated by pulse 80 because of the gap between the end of the channel 34 and the beginning of channel 35. Because this gap is very short, the vacuum in tubing 17d is not significantly affected and the product is retained on the end of the needle 62.

When the 180° position is reached, motors 18 and 24 driving the turret and the rotary plate 43 of the valve are again stopped. In this position, the through hole 45 is over the channel 35 and vacuum remains drawn through needle 62 so that the product picked up by the needle remains held on the end of needle 62. Since no activity takes place with the pick up assembly 12a in this position, it would be unnecessary for the turret to stop at this position, if it were a single arm machine. However, because the turret has two opposing arms it is necessary to stop the head 12a in this 180° position so that the pick up assembly 13a can begin its cycle (not shown) in the zero starting position.

After a predetermined time, the synchronous stepping motors 18 and 24 are again started and the turret and valve rotated. The through hole 45 passes from the channel 35 to channel 36. There is, again, a slight change in the vacuum in the tubing 17a as indicated by the small pulse 85 as the hole 45 traverses the gap between the channels. Again, however, the gap is so small that there is no substantial change in the vacuum drawn in the needle 62 and the product held on the end of the needle 62 is retained thereon. When the turret reaches the 270° position, the hole 44 is over channel 39, hole 45 is over channel 36, the synchronous motors 18 and 24 are stopped and a test is performed on the product held on the end of the needle 62. This test is accomplished by applying pressure to chamber 64 through the tubing 17a via the conduit 32 and channel 39 as indicated by pulse 82. This causes the piston 61 and the needle 62 to be forced down so that the product carried by the product comes in contact with the selected testing apparatus 10 (not shown). Upon completion of the test, this pressure pulse 82 is terminated and a vacuum indicated by pulse 83 is drawn in tubing 17a to cause the needle 62 to be drawn back up to its initial position. Because this testing of the device does not require the removal of the product from the needle 62, it is not necessary to break the vacuum in the pencil indicated by the pulse line 77, thus the product is constantly retained upon the end of the needle 62. Upon completion of the test, the synchronous stepping motors 18 and 24 are again activated and the turret and the rotating plate 43 are driven to the 360° position, i.e., the initial starting position. Thus a complete rotation of the turret and the rotary valve has been achieved. When the product reaches the 360° position, the through hole 44 is again aligned over the channel 40 and the through hole 45 is aligned over the channel 37 and the cycle described above is begun again as indicated by pulses 70a, 71a, 72a, 73a and 74a which are identical to pulses 70, 71, 72, 73 and 74 described above.

Figure 5:
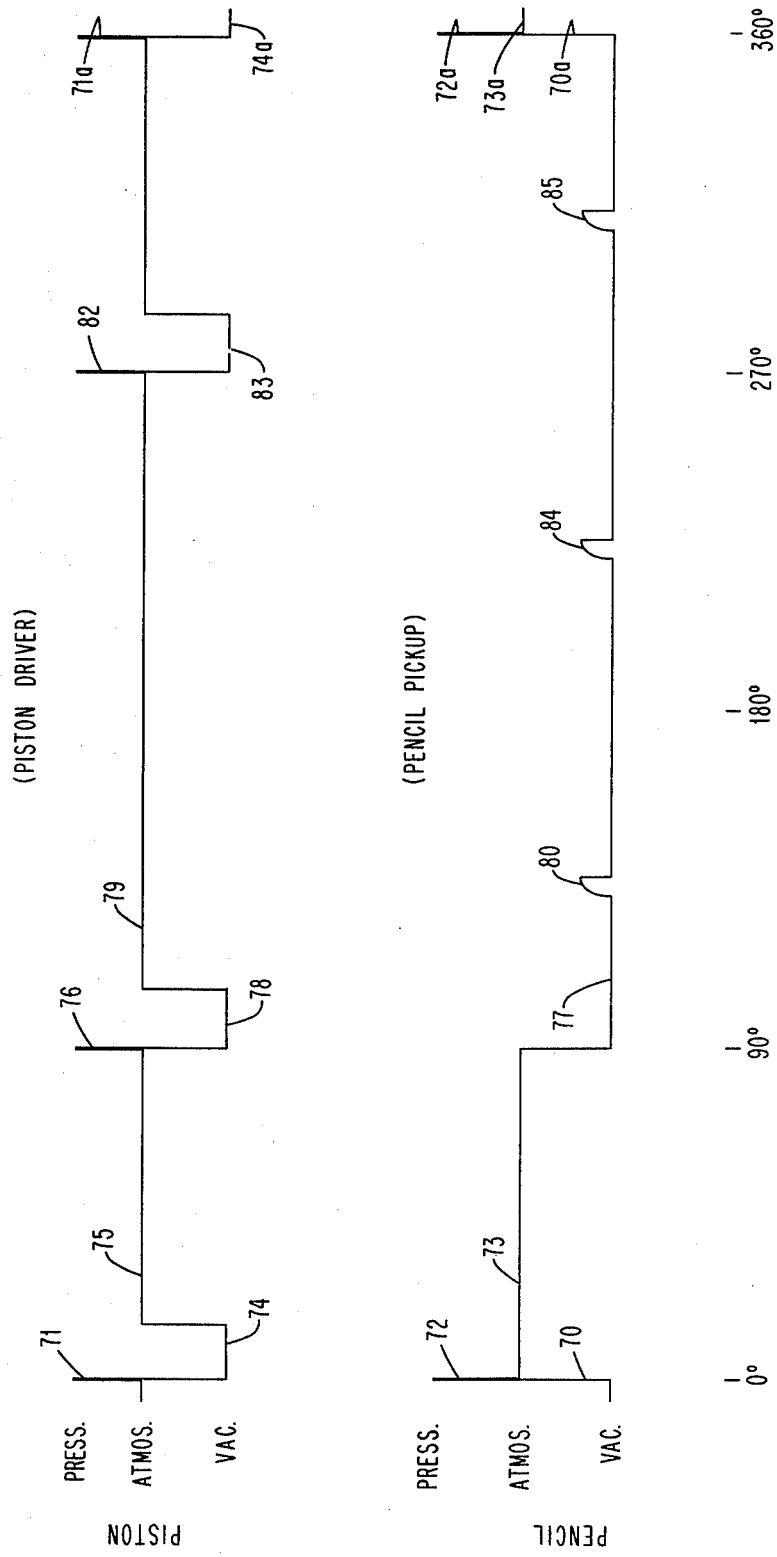
FIG. 5 is a plot of pressure and vacuum pulses being applied to one of the pick up assemblies of the rotating turret mechanism of FIG. 1 as the turret rotates through 360 degrees.

As can be noted from FIG. 5, the loading between the rotary plate 43 and the base plate 33 changes, as the vacuum pulses and air pressure pulses are applied to the pick up assembly. For example, between the 10° position and the 90° position the units are at atmospheric pressure, while between the 90° and the 110° position a heavy vacuum is being drawn on both the pencil 62 and the chamber 64. Also, it should be realized as more arms are added to the turret mechanism, the pulsing sequence becomes more complicated and that the variation between applied pressures, atmospheric pressures, and vacuums applied to the rotary valve becomes more complex considerably changing the frictional loading on the valve.

However, as indicated in this invention, the utilization of a separate stepping motor 24 which is coupled in synchronization to the stepping motor 18 used to drive the turret prevents this variation in friction loading on the valve 16 from being applied to and affecting the loading on the turret 11. Thus, the stepping motor 18 only has the constant turret load thereon. The channel in the fixed plate of the valve compensates for slight variations between the positioning of the rotary valve due to changes in frictional loading.

While the invention has been particularly shown and described with reference to preferred embodiments thereof, it will be understood by those skilled in the art that various changes in form and details may be made therein without departing from the spirit and scope of the invention.

What is claimed is:

1. An apparatus for rotationally carrying a work piece to a fixed position comprising:
   first and second synchronously driven stepping motors,
   a turret mechanism provided with a number of radially extending arms, each arm having a work piece holding and positioning means affixed thereto, said holding and positioning means being responsive to air pressure and vacuum pulses for picking up and holding a work piece as the turret mechanism traverses an arcuate path and depositing the work piece when said turret arrives at a receiving position,
   said first stepping motor driving said turret;
   rotary air pressure-vacuum valve means coupled to the work piece holding means for delivering air pressure and vacuum pulses to the work piece holding means for holding and positioning of a work piece;
   said rotary valve means having a multiple apertured distributor head with a fixed plate mounted thereon, said head being connected to a source of air pressure and a source of vacuum said fixed plate being provided with channels connected to the apertures in the distributor head and a rotary output plate provided with a selected number of apertures mounted on said fixed plate and adapted to mate with selected ones of said channels in said fixed plate as said rotary output plate is rotated by said second stepping motor,
   said rotary plate being further provided with a central shaft extending through said fixed plate and said distributor head, said shaft being coupled to and driven by said second stepping motor and
   flexible hollow tubings for transmitting said air pressure and vacuum pulses to each work piece holding and positioning means on the end of each radially extending arm of said turret being coupled between said distributor and said work piece holding means.

2. An apparatus for rotationally carrying a work piece to a fixed position comprising:
   a multiarmed turret mechanism;
   a first stepping motor directly coupled to said turret mechanism for rotationally driving said turret;
   work piece holding heads mounted on each arm of said turret;
   a rotary valve coupled to said turret for distributing vacuum and air pressure pulses from selected vacuum and air pressure sources to the work piece holding heads provided on each arm of said turret; and
   a second stepping motor coupled to said rotary valve being synchronously driven with said turret driving first motor
   said rotary valve being comprised of a distributor plate provided with a multiplicity of apertures connectable to said source of air pulses and a source of vacuum pulses, a fixed input plate mounted on said distributor plate and provided with arcuate channels mating with selected ones of said apertures in said distributor plate, and a rotary plate provided with selected number of apertures adapted to mate with selected ones of said channels in said fixed plate, said rotary plate being coupled to said heads mounted on the said multiple arms of said turret mechanism via flexible tubings and connected directly to said second stepping motor;
   to prevent vacuum loading frictions in said rotary valve from affecting the rotational movement of said turret.

3. The apparatus of claim 2 wherein said work piece holding heads mounted on the ends of said turret arms comprises pick up mechanisms responsive to said air pressure and to said vacuum pulses for picking up, holding and depositing work pieces.

* * * * *